(12) United States Patent
Krella et al.

(10) Patent No.: US 8,587,298 B2
(45) Date of Patent: Nov. 19, 2013

(54) CURRENT MEASURING DEVICE BY MEANS OF MAGNETICALLY SENSITIVE SENSOR FOR A POWER ELECTRONICS SYSTEM

(75) Inventors: Uwe Krella, Nürnberg (DE); Katrin Matthes, Nürnberg (DE); Gerhard Hiemer, Nürnberg (DE)

(73) Assignee: Conti Temic microelectronic GmbH (DE)

( * ) Notice: Subject to any disclaimer, the term of this patent is extended or adjusted under 35 U.S.C. 154(b) by 390 days.

(21) Appl. No.: 12/920,709

(22) PCT Filed: Feb. 27, 2009

(86) PCT No.: PCT/DE2009/000272
§ 371 (c)(1),
(2), (4) Date: Nov. 8, 2010

(87) PCT Pub. No.: WO2009/109168
PCT Pub. Date: Sep. 11, 2009

(65) Prior Publication Data
US 2011/0050219 A1 Mar. 3, 2011

(30) Foreign Application Priority Data
Mar. 5, 2008 (DE) .......................... 10 2008 012 665

(51) Int. Cl.
*G01R 33/06* (2006.01)
(52) U.S. Cl.
USPC .......................................................... 324/251

(58) Field of Classification Search
None
See application file for complete search history.

(56) References Cited

U.S. PATENT DOCUMENTS

| 5,418,454 A | 5/1995 | Togo |
| 5,523,677 A * | 6/1996 | Kawakami et al. ........ 324/117 R |
| 6,166,464 A | 12/2000 | Grant |
| 6,891,725 B2 | 5/2005 | Derksen |
| 7,259,556 B2 * | 8/2007 | Popovic et al. ............... 324/244 |
| 7,969,140 B2 * | 6/2011 | Teppan ......................... 324/127 |
| 2002/0167301 A1 | 11/2002 | Haensgen et al. |
| 2006/0052914 A1 | 3/2006 | Kubokawa et al. |
| 2007/0159861 A1 | 7/2007 | Meier et al. |
| 2008/0048642 A1 | 2/2008 | Aratani et al. |

FOREIGN PATENT DOCUMENTS

| DE | 43 00 373 A1 | 7/1993 |
| DE | 10 2004 017 292 A1 | 10/2005 |
| DE | 10 2006 006314 A1 | 11/2006 |

* cited by examiner

*Primary Examiner* — Melissa Koval
*Assistant Examiner* — Trung Nguyen
(74) *Attorney, Agent, or Firm* — RatnerPrestia

(57) ABSTRACT

A current measuring device in a power electronics system includes at least one circuit board and an electrical conductor which is guided through a frame surrounding the circuit board. The current measuring device includes a soft magnetic core surrounding the insulation of the electrical conductor, which core is arranged in the frame. The soft magnetic core is open at one location. A magnetically sensitive sensor, in particular a Hall sensor, is arranged in the recess of the soft magnetic core surrounding the insulation of the electrical conductor in order to detect the magnetic field strength.

6 Claims, 2 Drawing Sheets

CURRENT MEASURING DEVICE BY MEANS OF MAGNETICALLY SENSITIVE SENSOR FOR A POWER ELECTRONICS SYSTEM

CROSS REFERENCE TO RELATED APPLICATIONS

This application is the U.S. national phase application of PCT International Application No. PCT/DE2009/000272, filed Feb. 27, 2009, which claims priority to German Patent Application No. 10 2008 012 665.9, filed Mar. 5, 2008, which are both incorporated by reference in their entirety.

FIELD OF THE INVENTION

The invention relates to a current measuring device in power electronics systems. Power electronics systems in which current measuring may be required are for example pulse-controlled inverters, on-board voltage converters and battery monitoring equipment.

BACKGROUND OF THE INVENTION

DE 102006006314 A1, which is incorporated by reference, shows a device for current measuring which is integrated in a plug connection. For current sensing, at least one Hall sensor is arranged in a slit of an electrical conductor of the plug connection. The plug connection comprises a power pin which is arranged on a circuit board via a phase insulation jack. In the phase insulation jack, at least one toroidal core is concentrically arranged around the electrical conductor.

The plug connections provided for this device are not needed in all power electronics systems with current sensing, but they lead to an increased need for installation space. Moreover, they cause costs.

SUMMARY OF THE INVENTION

An object of the present invention is to minimize the need for installation space for power electronics systems with current sensing, which are in particular used in automotive engineering. Moreover, the costs are to be minimized.

The semiconductor elements of a power electronics system are arranged on a circuit board. In practice, preferably a direct bonded copper (DBC) ceramic substrate technology is used. A frame, preferably made of glass fibre-reinforced plastic, surrounding the circuit board is also referred to as bonding frame when it serves to fix bonding wires which are connected with the circuit board. This frame preferably serves to fix the busbars of the load lines and, where appropriate, of the control lines and their mechanical connection to the circuit board.

The busbars may be electrically connected to the DBC modules through bonding wires.

Preferably, the magnetic field lines which develop along an electrical conductor during the flowing of current are concentrated by an approximately annular soft magnetic core. Said soft magnetic core surrounds the insulation of the electrical conductor and is arranged in the frame. At one location, the rectangular soft magnetic core is interrupted, here is a recess. In such recess, a magnetically sensitive sensor, preferably a Hall sensor, is arranged. The electrical tension induced in a Hall sensor is proportional to the strength of the magnetic field which is induced by the current flowing in the conductor. The magnetic field may be measured using any magnetically sensitive sensor. In practice, a Hall sensor offers the advantage that it may be easily arranged by extending from the outside into the recess of the soft magnetic core pointing to the centre of the conductor.

The advantage of such arrangement of the soft magnetic core of the current measuring device in the frame and of the magnetically sensitive sensor in the recess of the soft magnetic core is to save installation space, whereby, in all, a higher packing density of the power electronics components may be achieved. Plug connections and additional lines which would be necessary in an external arrangement of the whole current measuring device become unnecessary. The mounting of the current measuring device is greatly simplified. Hereby, costs are minimized and reliability is increased at the same time.

In power electronics systems which comprise semiconductor switching elements such as insulated gate bipolar transistors (IGBT), e.g. in a pulse-controlled inverter, such switches are controlled by a separate electronic circuit which is preferably situated on a second circuit board. In a preferable embodiment, such circuit board is fixed to the frame, runs parallel to the plane of the circuit board on which the power components are arranged, and comprises evaluation electronics for the magnetically sensitive sensor. By this arrangement, a lot of installation space is saved, lines and plug connections become unnecessary, which leads to lower costs.

For removing heat from the power components, the circuit board may be soldered on a cooling body. As the soft magnetic core which surrounds the insulation of the electrical conductor is arranged in the frame, it is thermally coupled with the cooled circuit board via such frame. As the magnetically sensitive sensor is arranged in the recess of the soft magnetic core, it also benefits from the thermal coupling with the cooling body. This ensures a better thermal connection of the current measuring device to the cooling water, whereby thermal behaviour of the current measuring is improved.

For producing a power electronics system with an integrated current measuring device, the magnetically sensitive sensor and the soft magnetic core surrounding the insulation of the electrical conductor may be fixed in the frame during the injection moulding process for creating the glass fibre-reinforced plastic frame surrounding the circuit board. The magnetically sensitive sensor is in this way arranged in the recess of the soft magnetic core surrounding the insulation of the electrical conductor.

This method enables a further compaction of the existing installation space. For overmoulding with glass fibre-reinforced plastic, no further process step is necessary. It already occurs to fix the busbars and the fixing elements. Full overmoulding of the soft magnetic core and the magnetically sensitive sensor with glass fibre-reinforced plastic leads to a high vibration resistance of the current measuring device.

For producing a power electronics system in which a second circuit board comprises control electronics of the circuit breaker and evaluation electronics of the current measuring device, the soft magnetic core may be fixed in the frame and the recess of the soft magnetic core may be kept free during the injection moulding process for creating the frame surrounding the circuit board. The magnetically sensitive sensor is mechanically fixed on the circuit board for control electronics. When fixing the circuit board for control electronics to the frame, the magnetically sensitive sensor is placed in the recess of the soft magnetic core. This method enables high installation space compaction by saving an external circuit board, lines and plug connections, and also shows improved vibration resistance due to full overmoulding of the soft magnetic core with glass fibre-reinforced plastic.

BRIEF DESCRIPTION OF THE DRAWINGS

The invention is best understood from the following detailed description when read in connection with the accompanying drawings. Included in the drawings is the following figures.

DETAILED DESCRIPTION OF THE PREFERRED EMBODIMENTS

Figure 1:
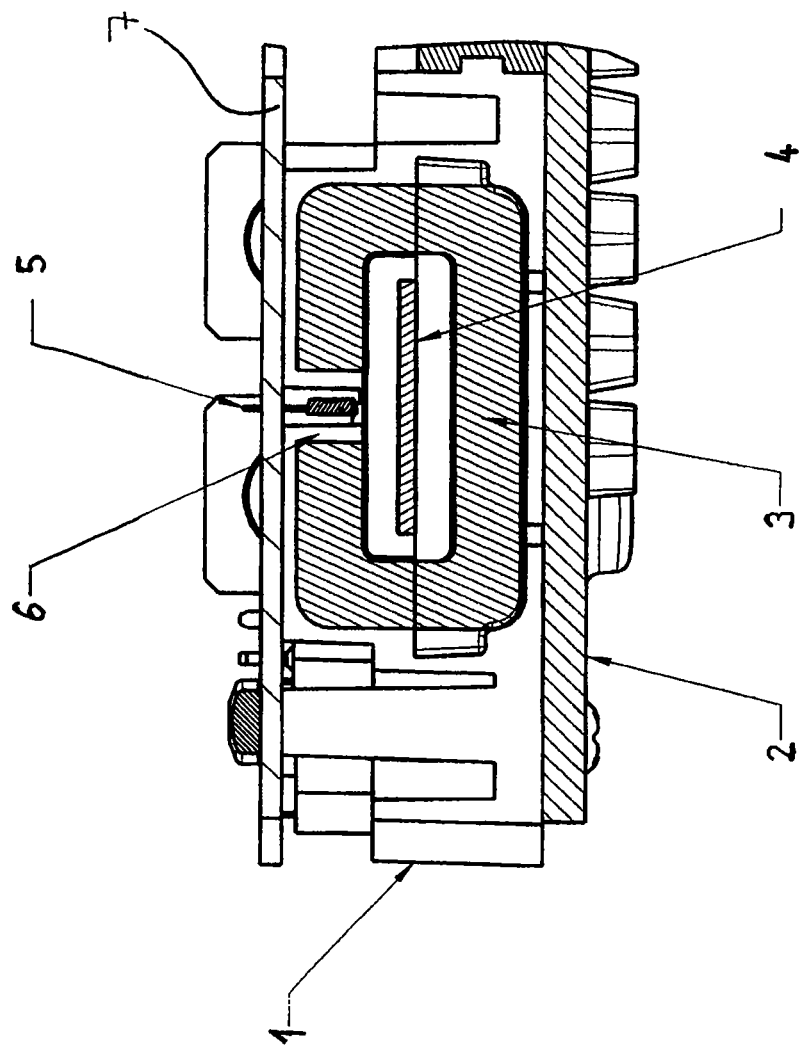
FIG. 1 shows a cross section of the current measuring device of a power electronics system.

In the cross section according to FIG. 1, an electrical conductor (4) which runs vertically to the sectional plane is represented. The current which flows through the conductor (4) is measured by the measuring device. For this purpose, the measuring device comprises a soft magnetic core (3) which is arranged in the frame (1). "In the frame (1)" means here that the soft magnetic core (3) is fully overmoulded with plastic in the area of the frame (1) according to a method described below.

The frame (1) surrounds the circuit board on which the power electronics components are arranged in a circuitry. The electrical conductor (4) is guided through the frame (1).

FIG. 1 shows the soft magnetic core (3) surrounding the insulation of the electrical conductor (4), which core is open at one location (6), in accordance with a preferred embodiment of the current measuring device. A magnetically sensitive sensor (5), preferably a Hall sensor, is arranged in the recess (6) of the soft magnetic core (3) surrounding the insulation of the electrical conductor (4).

As shown in FIG. 1 by way of example, the magnetically sensitive sensor (5) may be fixed on a second circuit board (7), which is fixed to the frame (1).

The soft magnetic core (3) may be thermally coupled with a cooling body (2) via the frame (1) surrounding the circuit board and thus via the circuit board by soldering the cooling body to the circuit board. Also the magnetically sensitive sensor (5) arranged in the recess (6) of the soft magnetic core (3) will benefit from direct cooling by the cooling body (2).

In the exemplary embodiment shown in FIG. 1, a second circuit board (7) is present which is fixed to the frame (1) and on which electronics for controlling the power electronics system, the magnetically sensitive sensor (5) as well as evaluation electronics for the magnetically sensitive sensor are arranged.

A method on how such system may be produced is described below:

The frame (1), which fulfils the function of a bonding frame in this exemplary embodiment, is produced in an injection moulding process during which a glass fibre-reinforced molten plastic material is cast in the desired form. The elements which are to be within the frame (1) are here overmoulded by the glass fibre-reinforced molten plastic material. In the exemplary embodiment shown in FIG. 1, these elements include the electrical conductor (4) and the soft magnetic core (3) of the current measuring device. The recess (6) of the soft magnetic core (3) surrounding the insulation of the electrical conductor (4) is kept free during injection moulding.

The magnetically sensitive sensor (5) is mechanically fixed on the circuit board for control electronics (7) and is placed in the recess (6) of the soft magnetic core (3) during subsequent fixing of said circuit board (7) to the frame (1).

A power electronics system without a second circuit board for control electronics (7) may be produced according to the method described below:

In addition to the electrical conductor (4) and the soft magnetic core (3) of the current measuring device, also the magnetically sensitive sensor (5) is overmoulded in the area of the frame (1) already during the injection moulding process for producing the frame (1). For this purpose, the magnetically sensitive sensor (5) is positioned in the recess (6) of the soft magnetic core (3) already prior to overmoulding.

Figure 2:
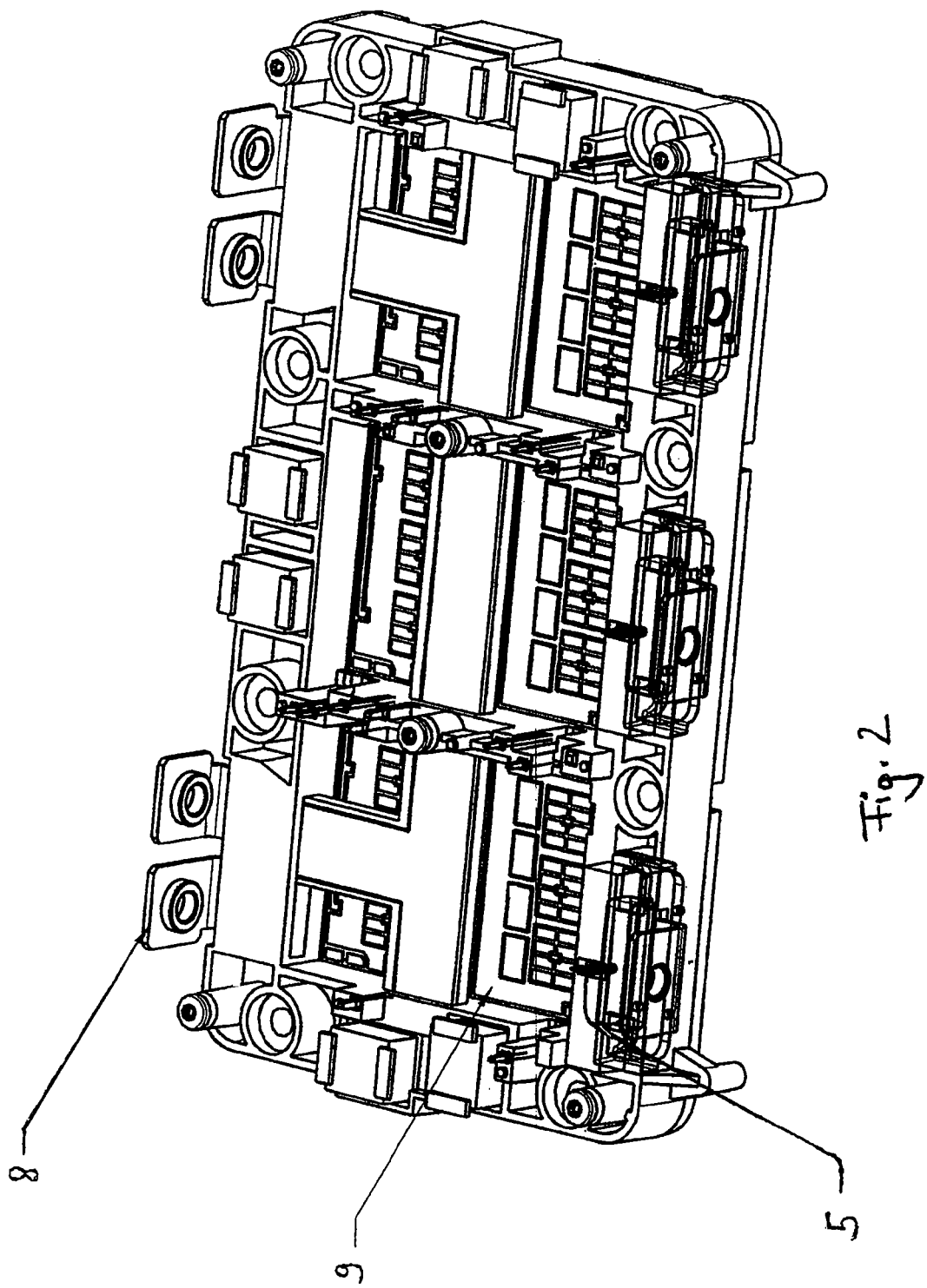
FIG. 2 shows a three-phase pulse-controlled inverter as an example for a power electronics system with a current measuring device.

FIG. 2 shows the circuit board (9) on which the semiconductor components of a power electrics system are arranged. The system shown in this exemplary embodiment is a three-phase pulse-controlled inverter with one current measuring device for each phase. The phase current is here (sic! missing word, translator's note) via an electrical conductor. In the exemplary embodiment shown, the three phase currents are conducted through the frame on busbars at the lower longitudinal side of the module.

For the circuit board (9), a direct bonded copper (DBC) ceramic substrate technology is used in this exemplary embodiment.

The frame fulfils the function of the bonding frame in this embodiment, as it serves to fix bonding wires which are connected with the circuit board (9). Moreover, the frame serves to fix the busbars (8) of the load lines and, where appropriate, of the control lines and their mechanical connection to the circuit board (9).

The busbars (8) may be electrically connected to the circuit board and/or the semiconductor elements mounted thereon via bonding wires.

FIG. 2 clearly shows that, by arranging the magnetic core in the frame and the magnetically sensitive sensor (5) in the recess of the magnetic core, no additional installation space is needed. The measuring and supply connections for the magnetically sensitive sensor (5) are led out upwards on the lower longitudinal side of the module in this exemplary embodiment.

The invention claimed is:

1. A power electronics system comprising:
    at least one circuit board and an electrical conductor which is guided through a frame surrounding the circuit board,
    a current measuring device comprising a soft magnetic core surrounding insulation of the electrical conductor, wherein the core is open at one location and fully overmoulded by material of the frame such that the material surrounds and contacts the core; and
    a magnetically sensitive sensor which is arranged in a recess of the soft magnetic core surrounding the insulation of the electrical conductor,
    wherein the frame mechanically fixes busbars to the at least one circuit board, the busbars corresponding to at least one of load lines or control lines of the power electronics system, and
    wherein the busbars are electrically connected to the at least one circuit board and/or semiconductor elements mounted on the at least one circuit board.

2. A power electronics system according to claim 1 further comprising a second circuit board, which is fixed to the frame surrounding said at least one circuit board,
    wherein electronics for controlling the power electronics system, the magnetically sensitive sensor and evaluation electronics for the magnetically sensitive sensor are arranged on the second circuit board.

3. A power electronics system according to claim 1, wherein the soft magnetic core is thermally coupled with a cooling body, which is soldered to said at least one circuit board, via the frame surrounding the circuit board and, therefore, via the circuit board.

4. A power electronics system according to claim 1, wherein the magnetically sensitive sensor is a Hall sensor.

5. A method for producing a power electronics system, the power electronics system comprising at least one circuit board, an electrical conductor which is guided through a frame surrounding the circuit board, a current measuring device comprising a soft magnetic core surrounding insulation of the electrical conductor, wherein the core is open at one location and fully overmoulded by material of the frame such that the material surrounds and contacts the core, and a magnetically sensitive sensor which is arranged in a recess of the soft magnetic core surrounding the insulation of the electrical conductor, said method comprising the steps of:

- fixing the magnetically sensitive sensor and the soft magnetic core in the frame during an injection moulding process for creating the frame surrounding the circuit board; and
- arranging the magnetically sensitive sensor in the recess of the soft magnetic core,
- wherein the frame mechanically fixes busbars to the at least one circuit board, the busbars corresponding to at least one of load lines or control lines of the power electronics system, and wherein the busbars are electrically connected to the at least one circuit board and/or semiconductor elements mounted on the at least one circuit board.

6. A method for producing a power electronics system, the power electronics system comprising a first circuit board, an electrical conductor which is guided through a frame surrounding the first circuit board, a current measuring device comprising a soft magnetic core surrounding insulation of the electrical conductor, wherein the core is open at one location and fully overmoulded by material of the frame such that the material surrounds and contacts the core, a magnetically sensitive sensor which is arranged in a recess of the soft magnetic core surrounding the insulation of the electrical conductor, and a second circuit board fixed to the frame surrounding the first circuit board, wherein electronics for controlling the power electronics system, the magnetically sensitive sensor and evaluation electronics for the magnetically sensitive sensor are arranged on the second circuit board, said method comprising the steps of:

- fixing the soft magnetic core of the current measuring device in the frame during an injection moulding process for creating the frame;
- maintaining the recess of the soft magnetic core in a free state;
- fixing the magnetically sensitive sensor to the second circuit board; and
- positioning the magnetically sensitive sensor in the recess of the soft magnetic core upon fixing the second circuit board to the frame.

\* \* \* \* \*

UNITED STATES PATENT AND TRADEMARK OFFICE
CERTIFICATE OF CORRECTION

PATENT NO.         : 8,587,298 B2                                   Page 1 of 1
APPLICATION NO.    : 12/920709
DATED              : November 19, 2013
INVENTOR(S)        : Krella et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 452 days.

Signed and Sealed this
Twenty-second Day of September, 2015

Michelle K. Lee
*Director of the United States Patent and Trademark Office*